(12) United States Patent
Hwang

(10) Patent No.: US 8,390,484 B2
(45) Date of Patent: Mar. 5, 2013

(54) METHOD AND APPARATUS FOR DECODING TRANSMITTED/RECEIVED DATA

(75) Inventor: Chang-ik Hwang, Seongnam (KR)

(73) Assignee: FCI Inc., Gyeonggi-do (KR)

( * ) Notice: Subject to any disclaimer, the term of this patent is extended or adjusted under 35 U.S.C. 154(b) by 59 days.

(21) Appl. No.: 13/179,521

(22) Filed: Jul. 9, 2011

(65) Prior Publication Data
US 2012/0007754 A1    Jan. 12, 2012

(30) Foreign Application Priority Data
Jul. 9, 2010   (KR) .................. 10-2010-0066576

(51) Int. Cl.
*H03M 7/12*   (2006.01)

(52) U.S. Cl. .......... 341/70; 370/210; 375/373; 375/149; 375/354; 375/376; 375/130; 348/473; 348/500; 348/312; 348/476; 348/373; 345/87; 345/96; 345/98; 345/101; 386/202; 386/203; 386/209

(58) Field of Classification Search .............. 341/50–90; 370/210; 375/130, 371, 373, 376, 354, 149; 348/473, 500, 312, 476, 373; 345/87, 96, 345/98, 101; 386/202, 203, 209
See application file for complete search history.

(56) References Cited

U.S. PATENT DOCUMENTS 5,828,993 A * 10/1998 Kawauchi .................... 704/202
7,596,279 B2 * 9/2009 Sugimoto et al. ............. 382/238
7,903,891 B2 * 3/2011 Sugimoto et al. ............. 382/238

* cited by examiner

*Primary Examiner* — Lam T Mai

(57) ABSTRACT

The present invention discloses a transmitted/received data decoding method and apparatus, which achieve effects of decoding performance improvement and synchronous detection. The decoding method includes setting a coded edge pattern, and filtering a received data by using the set coded edge pattern as a window; respectively computing absolute values of filtered values filtered by using the coded edge pattern windows; detecting a maximum absolute value from the computed absolute values; determining a sign (+/−) for the detected maximum absolute value; outputting an intermediate bit value of the corresponding original data as a resultant decoded value according to the determined sign and a window type (i.e. coded edge patter) with the selected maximum absolute value.

2 Claims, 6 Drawing Sheets

METHOD AND APPARATUS FOR DECODING TRANSMITTED/RECEIVED DATA

TECHNICAL FIELD OF THE INVENTION

The present invention relates to a novel method and apparatus for decoding received signals which are encoded into Manchester codes, and more particularly, to a method and apparatus for decoding transmitted/received data, which can realize performance improvement and sync detection to the received Manchester coded signals even in a condition where signal jitter phenomenon such as glitch and duty irregularity is serious.

BACKGROUND OF THE INVENTION

A Manchester encoder in a transmitter is shown in FIG. 1, the encoder encodes "1" or "0" of the original data into "01" or "10", and then transmits the same. In the descriptions of the present invention, the original data "1" is encoded into "01", the original data "0" is encoded into "10", whereas a reverse condition is also possible depending upon the system.

The Manchester encoder shown in FIG. 1 encodes the original data "110100 . . . " into "010110011010" and then transmits the same.

A Manchester decoder in a receiver is shown in FIG. 2, which executes a decoding process, in which "1" or "0" data is extracted from samples "01" or "10" after a glitch is eliminated by removing noises from the received data, and a phase of a reference clock is calibrated. That is, two times of sampling are executed, and the result values are decoded.

The received encoded data "010110011010 . . . " is decoded into the original data "110100 . . . ".

However, it is difficult for the Manchester decoder to extract data when the received signals are severely distorted due to a condition of poor channel or the like, and the decoding performance of the decoder is degraded accordingly.

FIG. 3 illustrates distortion of an input signal a conventional decoder. As shown in FIG. 3a, the received normal data "010110011010..." is likely to be distorted as shown in FIG. 3b and inputted into the Manchester decoder.

As shown in FIG. 2, data "1" or "0" are extracted from "01" or "10" by sampling the original data two times. Therefore, a decoding error occurs when the signal is distorted as shown in FIG. 3.

SUMMARY OF THE INVENTION

To solve the existed problem, an objective of the present invention is to provide a Manchester decoding method and apparatus, in which a pattern between a leading edge and a tailing edge of a leading edge and a tailing edge of a predetermined number of bits of the original data is analyzed, and then a coded edge pattern is found by filtering the received data through an edge pattern window, and the received data is decoded into decoded value. The Manchester decoding method and apparatus are able to promote the decoding performance even under a poor channel condition.

Another objective of the present invention is that the present invention executes decoding to a resultant output value by one time of sampling process through filtering using the coded edge pattern. This is different from the prior art in which the decoding is executed by two times of sampling processes. The present invention improves the decoding performance.

To achieve the above objectives, the present invention provides a decoding method for a data transceiver system. The method comprises a coded edge patter filtering process for setting an intermediate pattern between an edge at a leading bit and an edge at a tailing bit of an original data of a predetermined number of bits as a coded edge pattern after analyzing coded patterns according to data coded characteristics, and filtering a received data by using the set coded edge pattern as a window; an absolute value computing process for respectively computing absolute values of filtered values filtered by the coded edge pattern filtering process using the coded edge pattern windows; an absolute value comparing process for detecting a maximum absolute value from the absolute values computed by the absolute value computing process; a sign determining process for determining a sign for the maximum absolute value detected by the absolute value comparing process; a decoded value outputting process for outputting an intermediate bit value of the corresponding original data as a resultant decoded value according to the determined sign determined in the sign determining process and a window type with the maximum absolute value selected in the absolute value comparing process.

Furthermore, the present invention provides a decoding apparatus for a data transceiver system. The apparatus comprises a bit shift register for shifting a received data bitwise by a predetermined number of bits in correspondence to an oversampling clock; a reference clock generator for controlling the bitwise shifting of the received data and comparison synchronization; a coded edge pattern table for providing a coded edge pattern for filtering corresponding to the coded edge pattern of a transmitted data; a plurality of arithmetic units being commonly inputted with bit data of the bit shift register, then being respectively inputted with coded edge pattern data from the coded edge pattern table, multiplying the bit data by the edge pattern data according to an edge pattern type, and calculating a sum of products of the multiplications; an absolute value comparator for comparing absolute values of output data from the arithmetic units and selecting the edge patter type with the maximum absolute value; a timing controller for counting a reference clock of the reference clock generator and thereby taking an intermediate bit count value among the whole bits of the bit shift register as a comparing point for the absolute value comparator; a sign determinator for determining a sign (+/−) of the edge pattern with the maximum absolute value selected by the absolute value comparator under the control of the time controller; a decoded pattern table being set with decoded data corresponding to the edge pattern of the coded edge pattern table and the sign (+/−) of the corresponding pattern; a decoded value output unit for extracting the corresponding decoded data from the decoded pattern table as a decoded data according to the sign (+/−) of the edge pattern with the maximum absolute value determined by the sign determinator and outputting the decoded data.

According to the present invention, the window type (edge pattern type) with the peak value in computed in the vicinity of the edge portion corresponding to the filter center tap (R×D), and the resultant output value is decoded. Therefore, the improvement of decoding performance and synchronous detection can be easily realized even in a condition where signal jitter phenomenon such as glitch and duty irregularity is serious.

BRIEF DESCRIPTION OF THE DRAWINGS

The present invention will be described in detail in conjunction with the appending drawings, in which.

DETAILED DESCRIPTION OF THE INVENTION

An embodiment of the present invention will be described below.

Figure 1:
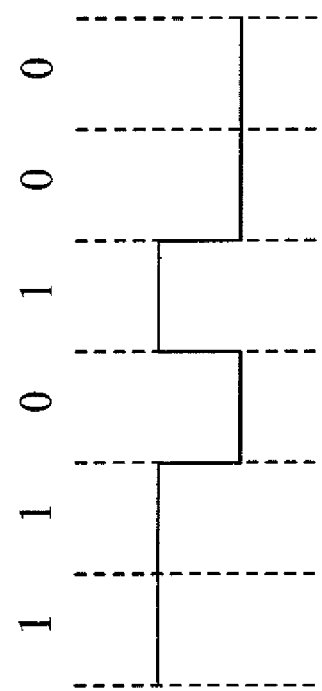
FIG. 1 is an illustration of current Manchester encoding.
Figure 1:
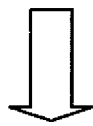
Figure 1:
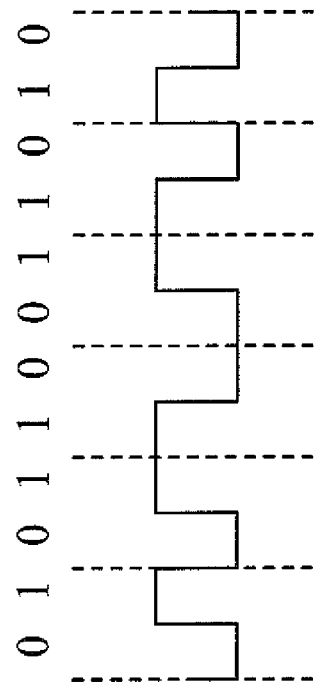
Figure 2:
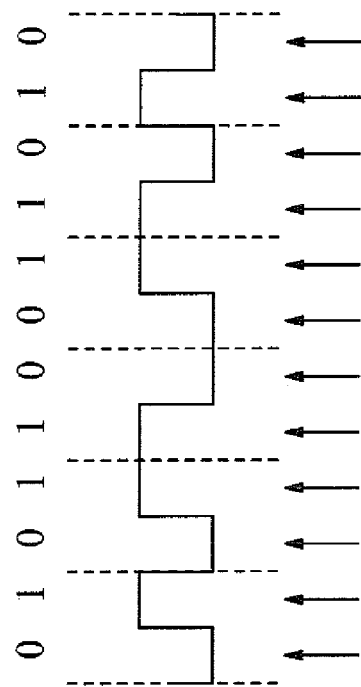
FIG. 2 is an illustration of current Manchester decoding.
Figure 2:
Figure 2:
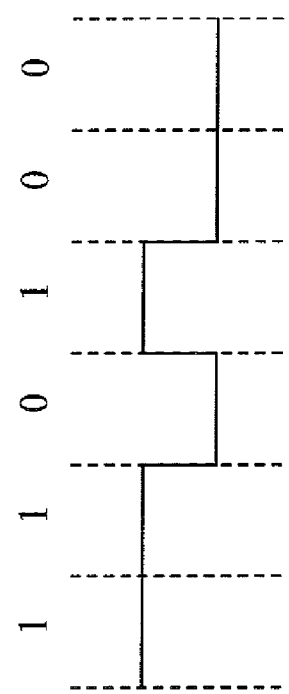
Figure 3:
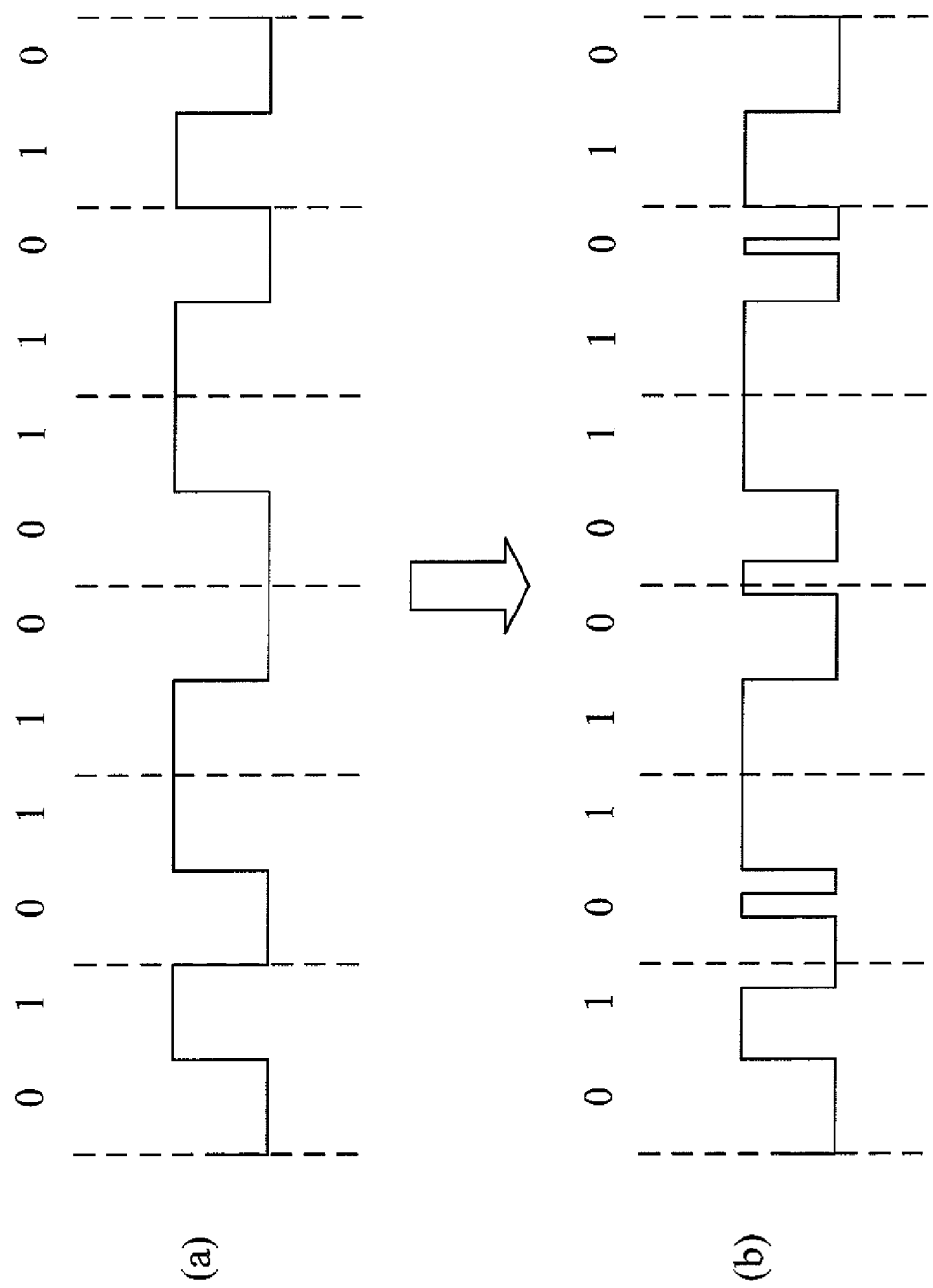
FIG. 3 illustrates an example of an input signal distortion of a conventional decoder.

The characteristics of Manchester encoding scheme can be learned from FIG. 1, coded data has specific patterns according to the original data. For example, when Manchester encoding scheme is applied to an original data of 3 bits, there are eight coded patterns and there are also eight patterns between the leading edge and the tailing edge. The eight coded edge patterns can be classified by using four filters. Similarly, there are 16 coded edge patterns, which can be classified by using 8 filters, when Manchester encoding is applied to an original data of 4 bits.

TABLE 1

Manchester coded edge patterns for original data of 3 bits

| Original Data | Manchester Coded Data | Coded edge pattern |
|---|---|---|
| "111" | "010101" | "1010" |
| "110" | "010110" | "1011" |
| "101" | "011001" | "1100" |
| "100" | "011010" | "1101" |
| "011" | "100101" | "0010" |
| "010" | "100110" | "0011" |
| "001" | "101001" | "0100" |
| "000" | "101010" | "0101" |

TABLE 2

Manchester coded edge patterns for original data of 4 bits

| Original Data | Manchester Coded Data | Coded edge pattern |
|---|---|---|
| "1111" | "01010101" | "101010" |
| "1110" | "01010110" | "101011" |
| "1101" | "01011001" | "101100" |
| "1100" | "01011010" | "101101" |
| "1011" | "01100101" | "110010" |
| "1010" | "01100110" | "110011" |
| "1001" | "01101001" | "110100" |
| "1000" | "01101010" | "110101" |
| "0111" | "10010101" | "001010" |
| "0110" | "10010110" | "001011" |
| "0101" | "10011001" | "001100" |
| "0100" | "10011010" | "001101" |
| "0011" | "10100101" | "010010" |
| "0010" | "10100110" | "010011" |
| "0001" | "10101001" | "010100" |
| "0000" | "10101010" | "010101" |

The most approaching form can be selected from practicable coded patterns for the received Manchester coded data by the filtering process corresponding to the coded edge pattern (or coded pattern). A window type for filtering is determined according to the decoding performance and system specification.

Figure 4:
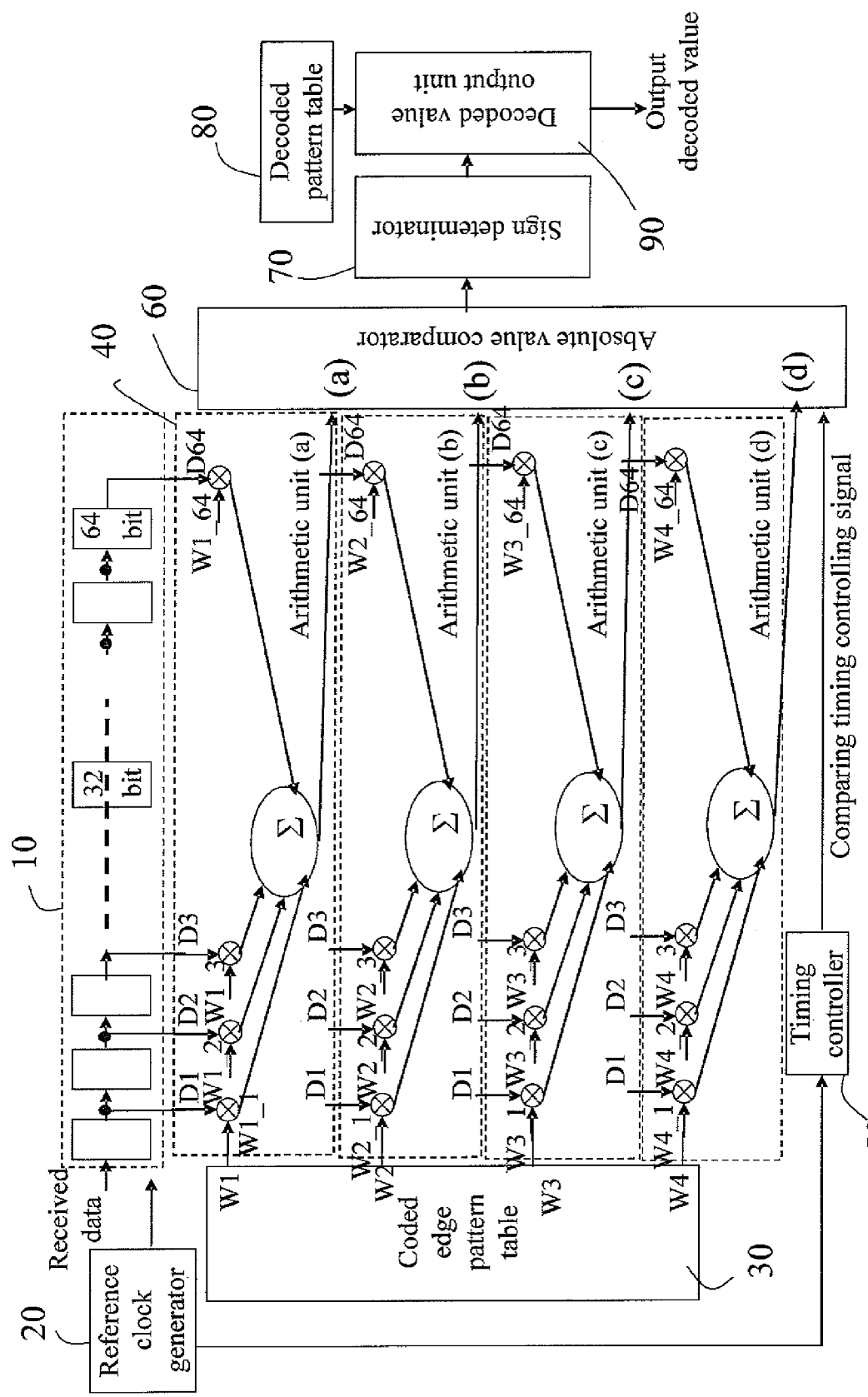
FIG. 4 shows a structure of a transmitted/received data decoding apparatus in accordance with the present invention.
Figure 5:
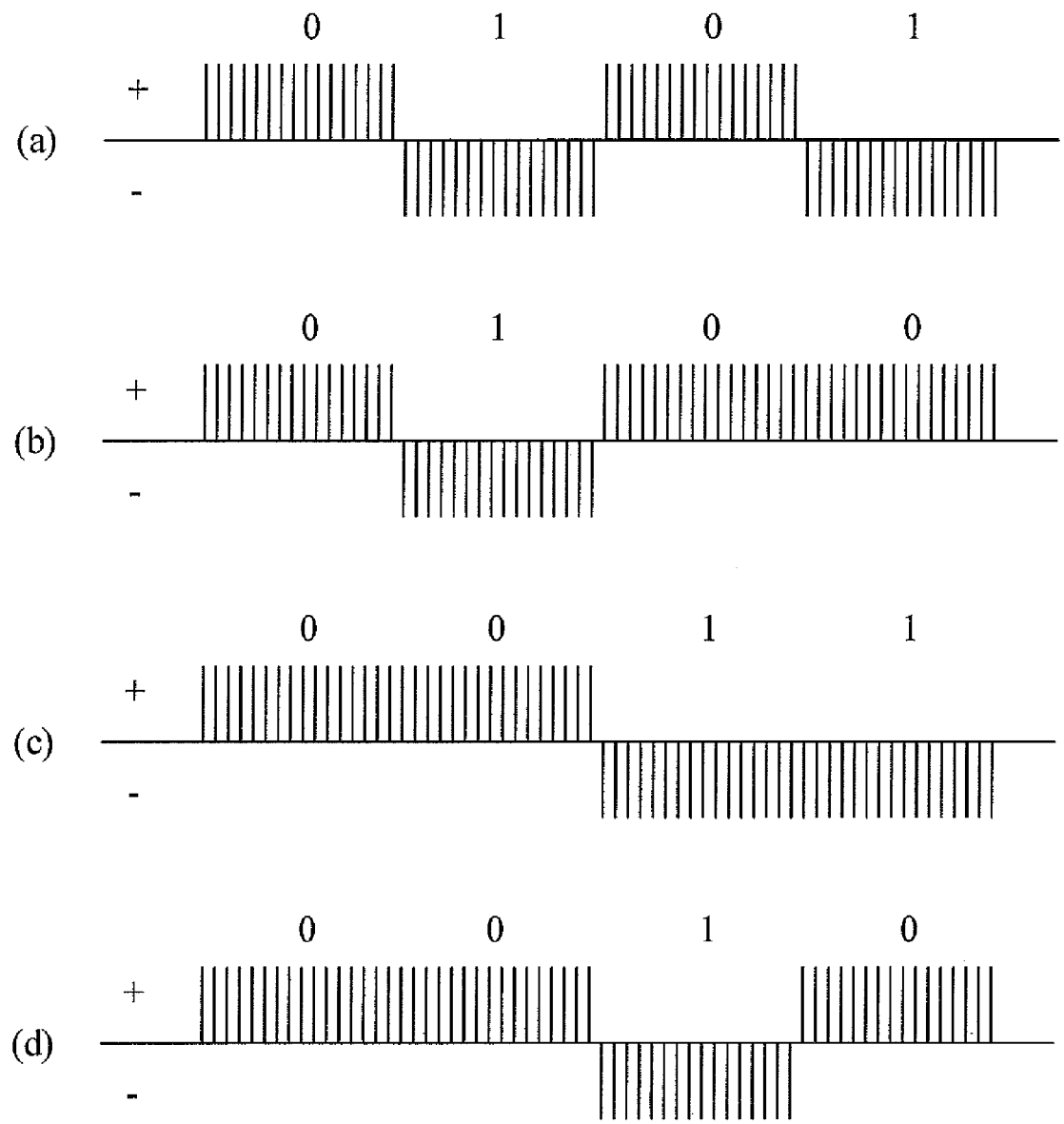
FIG. 5 is a schematic diagram showing an encoding edge pattern filtering window of a decoding method in accordance with the present invention.

For example, assumed that a DSRC system uses a sampling clock of 32.768 MHz and the Manchester coded edge patterns for 3-bit original data mentioned in the present invention as well as rectangular window FIT filtering, as shown in FIG. 4, a filter with four windows can be defined. The delay tap of the FIR filter is shared by the windows, but the arithmetics for the respective windows are different.

FIG. 4 is a block diagram of a transmitted/received data decoding apparatus in accordance with the present invention. As shown, the decoding apparatus comprises: a bit shift register 10 for shifting a received data bitwise by a predetermined number of bits in correspondence to an over-sampling clock; a reference clock generator 20 for controlling a bit shift of the received data and comparison synchronization; a coded edge pattern table 30 for providing coded edge patterns for filtering corresponding to coded edge patterns of a transmitted data; a plurality of arithmetic units 40 being commonly inputted with bit data (D1-D64) of the bit shift register 10, then being respectively inputted with coded edge pattern data (W1; W1_1, W1_2, . . . W1_64, W2; W2_1, W2_2, . . . W2_64, W3; W3_1, W3_2, . . . W3_64, W4: W4_1, W4_2, . . . W4_64), multiplying the bit data by the edge pattern data according to an edge pattern type, and calculating a sum of products of the multiplications; an absolute value comparator 60 for comparing absolute values of output data from the arithmetic units 40 and selecting the edge patter type with the maximum absolute value; a timing controller 50 for counting the reference clock of the reference clock generator 20 and thereby taking an intermediate bit count value among the whole bits of the bit shift register 10 as a comparing point for the absolute value comparator 60; a sign determinator 70 for determining a sign (+/−) of the edge pattern data with the maximum absolute value selected by the absolute value comparator 60 under the control of the time controller 50; a decoded pattern table 80, in which decoded data corresponding to the edge pattern data of the coded edge pattern table 30 and the sign (+/−) of the corresponding pattern is set; a decoded value output unit 90 for extracting the corresponding decoded data from the decoded pattern table 80 as the decoded data according to the sign (+/−) of the edge pattern with the maximum absolute value determined by the sign determinator 70 and outputting the decoded data.

In the structure according to the present invention, the bit shift register 10 and one arithmetic unit (a) have a window filtering function for the corresponding edge patter type. In an embodiment of the present invention, original data is set as 3-bit data. There will be eight coded edge patterns when the 3-bit data is encoded into Manchester codes so that each bit is expended into two bits. The eight coded edge patterns are classified into four types when comparison is executed to 3 bits. Four filtering types are used to distinguish the sign (+/−) of the most significant bit. Eight edge patterns can be distinguished by using the sign determination.

For example, the 3-bit Manchester codes "1010, 1011, 1100, 1101, 0010, 0011, 0100, 0101" are shown in Table 1. Four types (010, 011, 100, 101) can be distinguished when the least significant three bits are compared. The sign can be determined according to the most significant one bit "1" or "0".

In addition, a decoded table is set, in which intermediate bit values of the original data corresponding to the respective edge patterns are set as decoded data. Therefore, in the embodiment of the present invention, the coded edge patterns are set based on the 3-bit original data, and four arithmetic units (a), (b), (c), (d) are constructed.

As shown in FIG. 4, among the outputs of the filters of four types of windows (in the embodiment, the bit shift register 10 and one arithmetic unit (a) are combined as a window filter), one of the eight coded edge patterns can be selected according to the window type (coded edge pattern, type) with the maximum absolute value and the sign (+ or −) of the peak value of the corresponding absolute value. The intermediate bit value of the original data corresponding to the pattern becomes the resultant output value after decoding.

TABLE 3

Decoded table corresponding to window types with peak values

| Original Data | Coded edge pattern | Window type with peak value | Decoder output value |
|---|---|---|---|
| "111" | "1010" | − (a) | 1 |
| "110" | "1011" | − (b) | 1 |
| "101" | "1100" | − (c) | 0 |
| "100" | "1101" | − (d) | 0 |
| "011" | "0010" | + (d) | 1 |
| "010" | "0011" | + (c) | 1 |
| "001" | "0100" | + (b) | 0 |
| "000" | "0101" | + (a) | 0 |

In the conventional technique, the resultant output value is decoded through two times of sampling processes. However, in the present invention, the resultant output value is decoded through one sampling process executed to the vicinity of the corresponding edge portion of a filter center tap (R×D). For this purpose, the timing controller 50 is provided for controlling the comparing point of the absolute value comparator 60. The timing controller 50 generates a timing control signal to activate the comparison of the absolute value at the point of the intermediate bit, that is, the 32 bit, of the bit shift register 10.

However, the corresponding edge of the center tap (R×D) is not the only one point where the sampling can be executed. For example, in a system environment in which a duty ratio is seriously irregular, decoding can be executed to a preamble signal as the start point of a slot of a communication frame, thereby the sampling can be executed in the corresponding slot by executing a regulate synchronous detection process to the phases at the sampling points FIG. 6 is a timing chart for schematically showing a transmitted/received data decoding process of the present invention.

Figure 6:
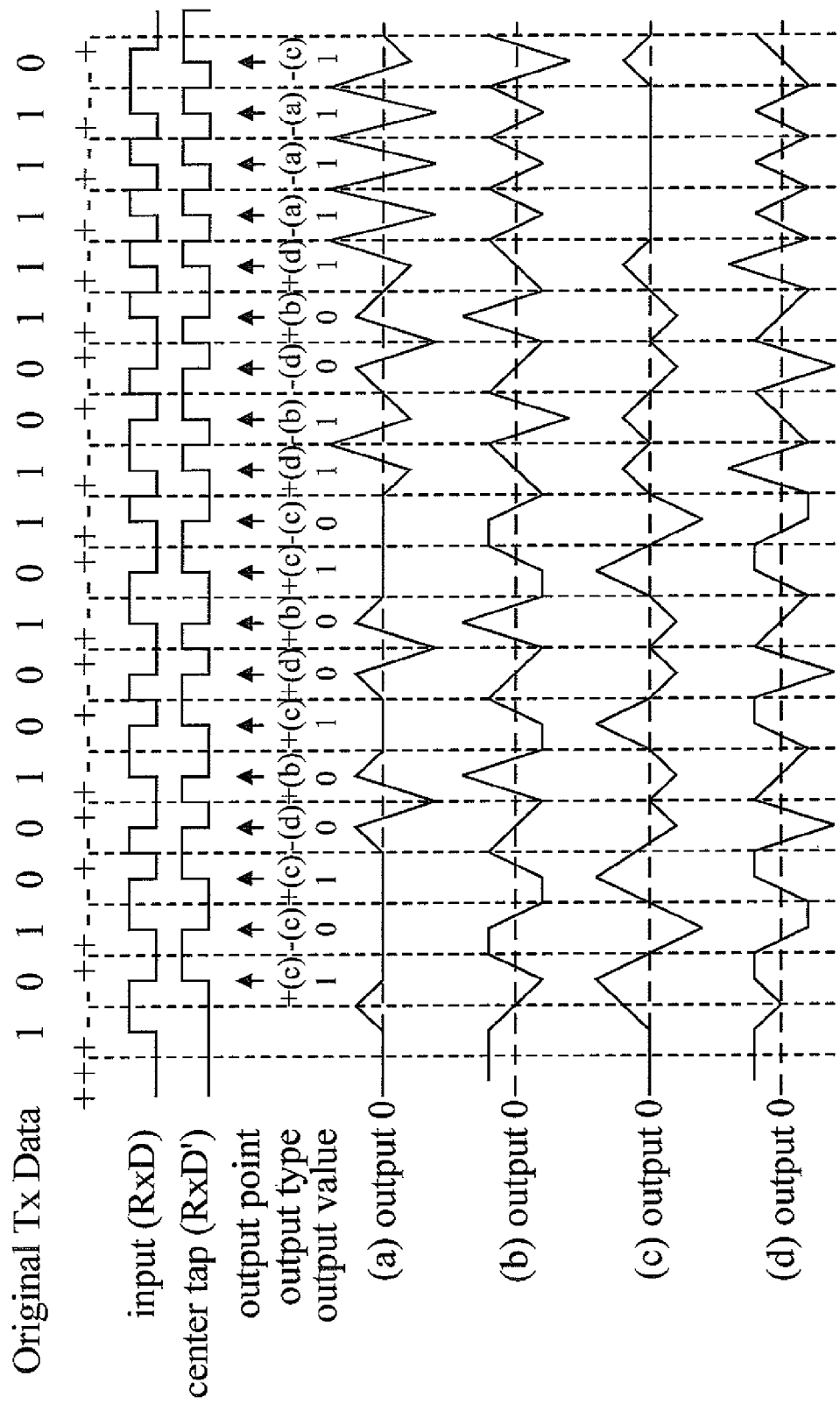
FIG. 6 is a timing diagram for describing the decoding method in accordance with the present invention.

As shown in FIG. 6 (1), the original data "10100 . . . " is encoded by expanding one bit into two bits of data in the encoding process. That is, the encoding 1→01, 0→10, is described for example.

Accordingly, as shown in FIG. 6 (2), the encoded data in which the original data "1" is encoded into "01", the original data "0" is encoded into "10" becomes the received data of the receiver, i.e. the input R×D.

Signal transmitting and receiving are executed in synchronization with the over-sampling clock according to a transmitting/receiving frequency. In a condition wherein a 32× over-sampling clock is used in synchronization, each original data sampling clock becomes 64 sample bits since one bit of the original data is encoded into two bits of the encoded data. Accordingly, the bit shift register 10 is constructed as a 64 sample bit shift register.

The intermediate bit, i.e. the 32 bit point, serves as the absolute value comparing point so as to detect the coded edge pattern from the bit shift register described above. The timing of the absolute value comparison is controlled by the timing controller 50, which counts the reference clock.

As shown in FIG. 6 (3), the absolute value comparison occurs at the edge point of the center tap (32 sample bit delay) data (R×D).

As shown in FIG. 6 (4), the absolute value comparator 60 compares the absolute values at every 32 sample bit edge point. These points are the output focal points. The respective arithmetic units (a), (b), (c), (d) execute arithmetic to the 64 sample bit data and the edge patterns of the coded edge pattern table (30) (W1; W1_1, W1_2, . . . W1_64, W2; W2_1, W2_2, . . . W2_64, W3; W3_1, W3_2, . . . W3_64, W4: W4_1, W4_2, . . . W4_64), the arithmetic units multiply the original data by the pattern data, and then compute the sum of the whole 64 sample bits according to the types. The computed values are generated as the outputs shown in FIG. 6 (5) to FIG. 6 (8).

The absolute value comparator 60 compares the absolute values of the data of FIG. 6 (5) to FIG. 6 (8), and selects the type with the maximum value. The so called "type" indicates the coded edge pattern type, which is used to determine the sign (+/−) of the selected edge pattern type. The sign determination is done by judging the signs (+/−) of the computed values of the arithmetic units. The decoded values are extracted from the decoded pattern table 80 by using the sign determination, and the decoded value output unit 90 outputs the decoded data accordingly.

The decoded pattern table is illustrated as shown in Table 3. The decoded data is determined according to the respective coded edge patterns. The intermediate value of the original data is set as the decoded data.

The window type (edge pattern type) with the peak value is computed in the vicinity of the corresponding edge portion of the filter center tap (R×D), and then the resultant value is decoded. Therefore, decoding performance improvement and sync detection are easily realizable even in a condition where the jitter such as the phenomenon of glitch or duty irregulation is serious.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A transmitted/received data decoding method comprising:
   a coded edge patter filtering process for setting an intermediate pattern between an edge at a leading bit and an edge at a tailing bit of an original data of a predetermined number of bits as a coded edge pattern after analyzing coded patterns according to data coded characteristics, and filtering a received data by using the set coded edge pattern as a window;
   an absolute value computing process for respectively computing absolute values of filtered values filtered by the coded edge pattern filtering process using the coded edge pattern windows;
   an absolute value comparing process executed by an absolute value comparator for detecting a maximum absolute value from the absolute values computed by the absolute value computing process;
   a sign determining process for determining a sign for the maximum absolute value detected by the absolute value comparing process; and
   a decoded value outputting process for outputting an intermediate bit value of the corresponding original data as a resultant decoded value according to the determined sign determined in the sign determining process and a window type with the maximum absolute value selected in the absolute value comparing process.

2. A transmitted/received data decoding apparatus comprising:

a bit shift register for shifting a received data bitwise by a predetermined number of bits in correspondence to an over-sampling clock;

a reference clock generator for controlling the bitwise shifting of the received data and comparison synchronization;

a coded edge pattern table for providing a coded edge pattern for filtering corresponding to the coded edge pattern of a transmitted data;

a plurality of arithmetic units being commonly inputted with bit data (D1-D64) of the bit shift register, then being respectively inputted with coded edge pattern data from the coded edge pattern table, multiplying the bit data by the edge pattern data according to an edge pattern type, and calculating a sum of products of the multiplications;

an absolute value comparator for comparing absolute values of output data from the arithmetic units and selecting the edge patter type with the maximum absolute value;

a timing controller for counting a reference clock of the reference clock generator and thereby taking an intermediate bit count value among the whole bits of the bit shift register as a comparing point for the absolute value comparator;

a sign determinator for determining a sign (+/−) of the edge pattern with the maximum absolute value selected by the absolute value comparator under the control of the time controller;

a decoded pattern table being set with decoded data corresponding to the edge pattern of the coded edge pattern table and the sign (+/−) of the corresponding pattern; and a decoded value output unit for extracting the corresponding decoded data from the decoded pattern table as a decoded data according to the sign (+/−) of the edge pattern with the maximum absolute value determined by the sign determinator and outputting the decoded data.

* * * * *